(12) United States Patent
Kuan et al.

(10) Patent No.: US 6,860,620 B2
(45) Date of Patent: Mar. 1, 2005

(54) LIGHT UNIT HAVING LIGHT EMITTING DIODES

(75) Inventors: Yew Cheong Kuan, Penang (MY); Seong Choon Lim, Penang (MY); Kar Phooi Foong, Penang (MY); Wen Ya Ou, Penang (MY)

(73) Assignee: Agilent Technologies, Inc., Palo Alto, CA (US)

( * ) Notice: Subject to any disclaimer, the term of this patent is extended or adjusted under 35 U.S.C. 154(b) by 17 days.

(21) Appl. No.: 10/434,818

(22) Filed: May 9, 2003

(65) Prior Publication Data

US 2004/0223327 A1 Nov. 11, 2004

(51) Int. Cl.⁷ ............................ F21V 21/05; F21V 29/00
(52) U.S. Cl. ........................................ 362/294; 362/373
(58) Field of Search ................................ 362/294, 373; 361/760, 761, 764, 767, 768, 684, 686, 720, 777; 174/252, 250

(56) References Cited

U.S. PATENT DOCUMENTS

| 3,821,847 A | * | 7/1974 | Melse et al. ................... 29/827 |
| 4,735,847 A | * | 4/1988 | Fujiwara et al. ............. 428/209 |
| 5,436,809 A | | 7/1995 | Brassier et al. |
| 6,299,337 B1 | * | 10/2001 | Bachl et al. .................. 362/545 |
| 6,441,943 B1 | * | 8/2002 | Roberts et al. .............. 359/267 |
| 6,520,669 B1 | * | 2/2003 | Chen et al. ................... 362/545 |

FOREIGN PATENT DOCUMENTS

| EP | 1002696 A2 | 11/1999 |
| WO | WO99/36896 | 7/1999 |

* cited by examiner

Primary Examiner—Alan Cariaso
Assistant Examiner—Mark Tsidulko
(74) Attorney, Agent, or Firm—Thomas X. Li

(57) ABSTRACT

A light unit is provided that includes a thin flexible substrate layer. A number of flexible electrical tracks are formed on the flexible substrate layer. A number of Light Emitting Diodes (LEDs) are arranged on the flexible substrate layer along the electrical tracks and are electrically connected to the electrical tracks such that the light unit is both thin and flexible.

21 Claims, 5 Drawing Sheets

LIGHT UNIT HAVING LIGHT EMITTING DIODES

BACKGROUND

The invention relates to a light unit. More particularly, the present invention relates to a light unit that includes Light Emitting Diodes (LEDs) and that is both thin and flexible.

Current incandescent lamps typically require too much room, especially when used in a closed room with restricted outer dimensions, such as in a motor vehicle (e.g., a passenger car).

Typically, an incandescent lamp has a depth of 70 mm to 150 mm, and hence separate tail lamp pockets need to be provided in and sealed against the quarter panels of the cars in order to accommodate the incandescent lamp. Such tail lamp pockets take up luggage space from the boot of the cars. Moreover, incandescent lamps require parabolic reflectors for light concentration and hence are limited to simple circular or rectangular shapes, making it difficult to match the external contour of the body of the car. Incandescent lamps are also easy to be damaged, and hence require to be replaced frequently.

Therefore, a much thinner and flexible light unit for lamps is desirable.

SUMMARY OF THE INVENTION

One feature of the present invention is to provide a light unit that is thin and flexible.

Another feature of the present invention is to provide a light unit having LEDs as light source.

In accordance with one embodiment of the present invention, a light unit is provided that includes a thin flexible substrate layer. A number of flexible electrical tracks are formed on the flexible substrate layer. A number of Light Emitting Diodes (LEDs) are arranged on the flexible substrate layer along the electrical tracks and are electrically connected to the electrical tracks such that the light unit is both thin and flexible.

In accordance with another embodiment of the present invention, a motor vehicle lamp is provided that includes a light unit that includes a flexible substrate layer. A number of flexible electrical tracks are formed on the flexible substrate layer. LEDs are arranged on the flexible substrate layer along the electrical tracks and are electrically connected to the electrical tracks such that the light unit is both thin and flexible.

DETAILED DESCRIPTION

Figure 1:
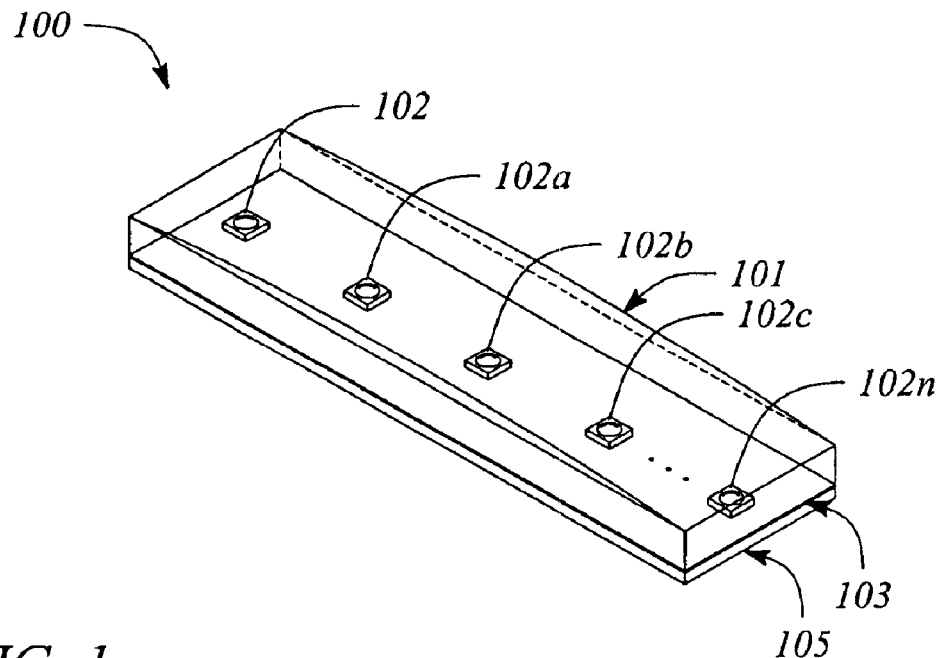
FIG. 1 shows a perspective view of a light unit according to one embodiment of the invention.

FIG. 1 shows a light unit 100 that implements one embodiment of the present invention. In accordance with one embodiment of the present invention, the light unit 100 may include a number of Light Emitting Diodes (e.g., LEDs 102 through 102$n$) arranged on a thin and flexible substrate (i.e., the substrate 103). The light unit 100 is thin and flexible, which in turn allows the light unit 100 to have a wide variety of applications.

In one embodiment, the light unit 100 can be employed to build a motor vehicle lamp (see FIGS. 6–9). In a further embodiment, the light unit 100 can be employed in other applications in which light source is needed (e.g., lamps in rooms of buildings or working lamps to be carried by hand).

As will be described in more detail below, the light unit 100 includes a thin and flexible substrate layer 103. A number of flexible tracks (e.g., the tracks 121–126 in FIG. 4) are formed on the flexible substrate layer 103. The tracks 121–126 include electrical tracks (e.g., the tracks 121, 123–124, and 126) and heat sink tracks (e.g., the tracks 122 and 125). The tracks may be arranged in a predetermined pattern on the substrate layer 103 in accordance with a desired light form and intensity.

The LEDs (e.g., LEDs 102–102$n$) are small surface mountable LEDs and may include heat sink. The LEDs are arranged (e.g., attached using the Surface Mounting Technology) on the flexible substrate 103 along the tracks (e.g., the tracks 121–126) and are electrically connected to the electrical tracks (e.g., the tracks 121, 123–124, and 126) such that the light unit 100 is both thin and flexible. This thin light unit 100 can be used to make a vehicle lamp without the corresponding lamp pocket, which were otherwise necessary for incandescent lamps were not necessary anymore. For example, a vehicle lamp with the light unit 100 in accordance with one embodiment of the present invention can be made with a thickness of, for example, less than 10 mm. In one embodiment, the light unit 100 has a thickness of less than 8 mm.

In addition, the light unit 100 may also include a heat sink metal frame (i.e., metal frame 108) on the substrate 103. The light unit 100 may also include a metal plate (e.g., the metal plate 105) that may serve both as heat sink and base support for the substrate 103. An optical lens (e.g., the lens 101) may be employed for the light unit 100.

In addition, as the whole light unit 100 is flexible, it can be bent to a desired shape or contour, i.e. it can be easily formed to follow the contour of a transparent part of a corresponding lamp. The light unit 100 in accordance with one embodiment of the present invention will be described in more detail below, also in conjunction with FIGS. 1–9.

Figure 2:
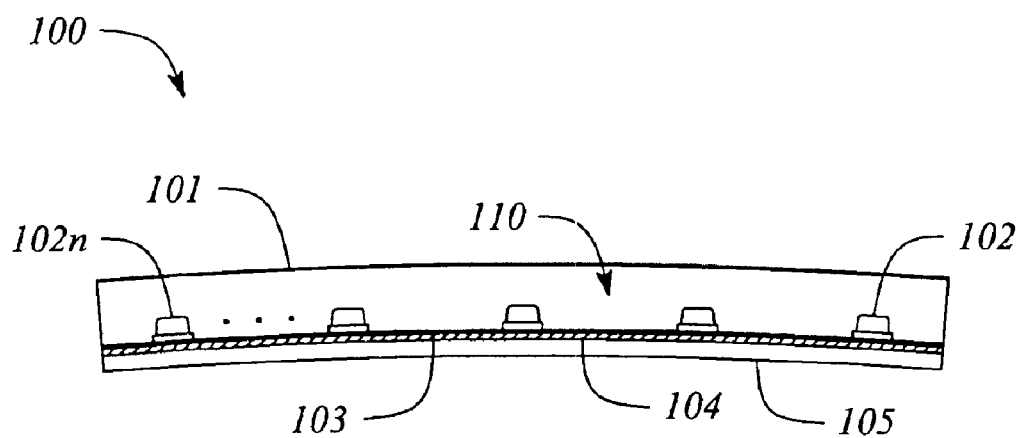
FIG. 2 shows a side cross-sectional view of the light unit as shown in FIG. 1.
Figure 3:
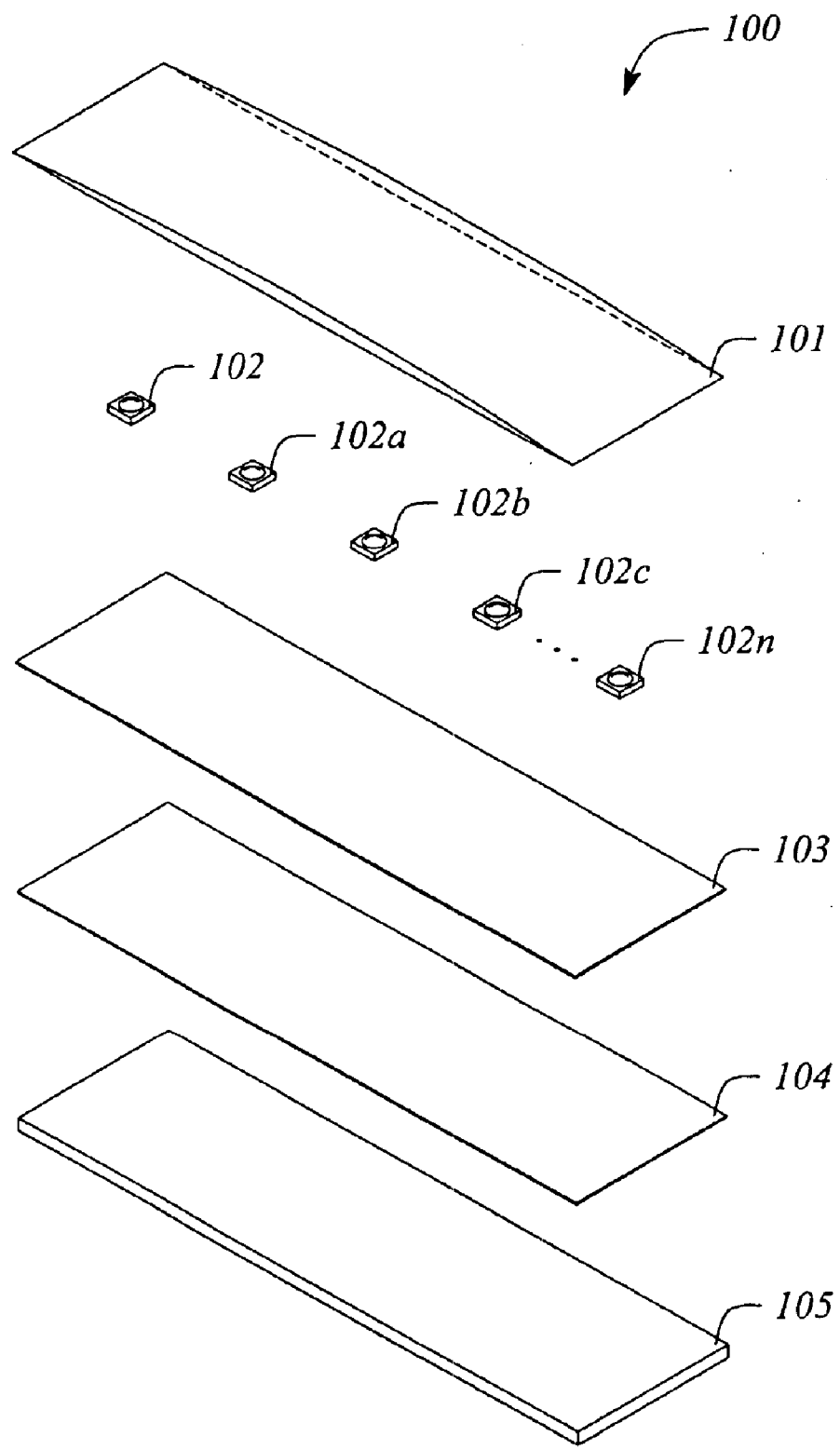
FIG. 3 shows an exploded view of the light unit of FIGS. 1–2.
Figure 4:
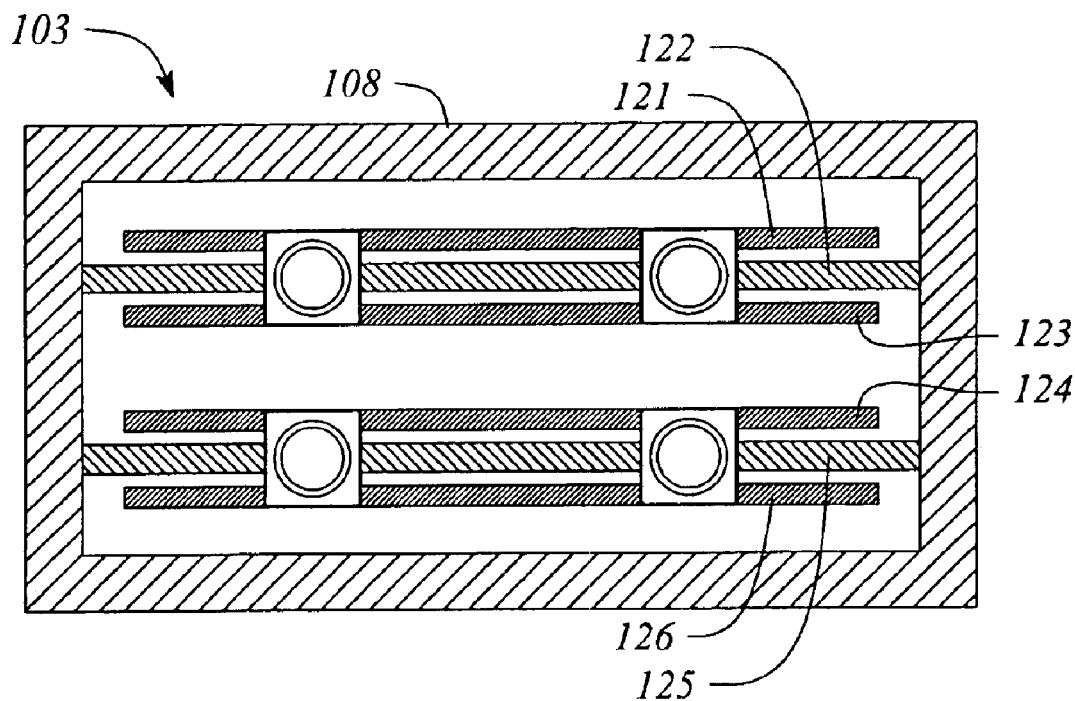
FIG. 4 is a plan view of a partial circuit layout on the flexible substrate of the light unit of FIGS. 1–3, showing a heat sink track layer arranged between an anode track layer and a cathode track layer.
Figure 5:
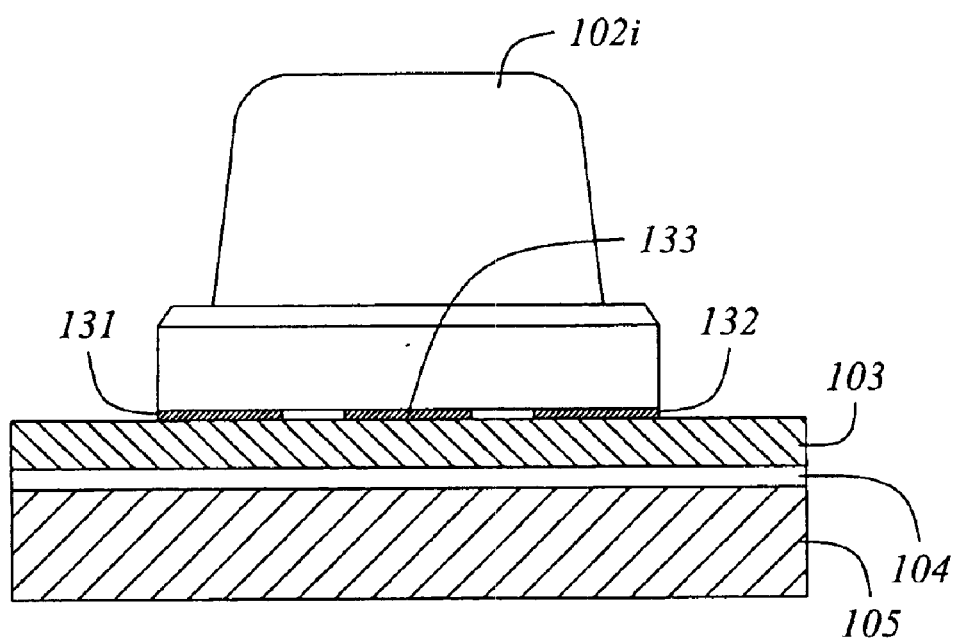
FIG. 5 is a cross-sectional view of a portion of the light unit of FIGS. 1–3, showing in a LED mounted on the tracks (both electrical and heat sink tracks) on the flexible substrate that is attached to the metal plate via an adhesive tape or paste.

Referring to FIGS. 1–5, the light unit 100 is shown to have the lens 101, the LEDs 102–102$n$, the flexible substrate 103, a thermal conductive tape 104, and the heat sink plate 105. The tracks 121–126 (see FIG. 4) are arranged on the substrate 103 and the substrate 103 is attached to the heat sink plate 105 via the tape 104. FIG. 2 also shows an air gap 110 between the LEDs 102–102n and the lens 101. FIG. 3 shows the exploded view of the light unit 100 (without showing the tracks on the substrate 103). FIG. 4 shows the partial and illustrative layout of the tracks (i.e., the tracks 121–126) for illustration purposes. FIG. 5 shows how each of the LEDs 102–102n is mounted on the tracks (e.g., the tracks 121–126 of FIG. 4) on the flexible substrate 103 that is attached to the metal plate 105 via the adhesive tape 104.

As described above, the flexible substrate 103 is a thin and flexible substrate. This means that the substrate 103 can be made of a film or foil material, and can be easily bent by hand. The substrate 103 may be made of an electrically insulating material. According to one embodiment, the flexible substrate 103 is made of a synthetic material (e.g., polyamide). A substrate made of the above-mentioned polyamide can provide for a sufficient electrical insulation as well as for a sufficient flexibility and strength.

In one embodiment, the flexible substrate 103 is a flexible printed circuit board. In another embodiment, the flexible substrate 103 has a thickness of about 25.4 micrometers. Alternatively, the substrate 103 may have other thickness.

The tracks 121–126 (see FIG. 4) include electrical tracks (e.g., the tracks 121, 123–124, and 126) and heat sink tracks (e.g., the tracks 122 and 125). Each of the electrical tracks is of a conductive material (e.g., metal). The tracks may be arranged in a predetermined pattern on the substrate layer 103 in accordance with a desired light form and intensity.

The electrical tracks (e.g., the tracks 121, 123–124, and 126) include at least an anode track or trace (e.g., the track 121 or 124) and a cathode track or trace (e.g., the track 123 or 126) extending parallel to each other. An anode terminal and a cathode terminal of a corresponding LED are attached to the corresponding tracks. Therefore, various light patterns having light spots and dark zones can be formed in accordance with the form of a light or lamp to be created. FIG. 8 shows, as an example, a schematic layout of electrical and heat sink tracks to be used in a light unit for the motor vehicle lamp 300 shown in FIGS. 6–7, which will be described in more detail below.

In one embodiment, each of the tracks 121–126 is formed of a single material, such as a special metal. In another embodiment, each of the tracks 121–126 is formed of a multi-layer metal structure (not shown). In this embodiment, the track structure may include a copper layer, a nickel layer on top of the copper layer, and a gold layer on top of the nickel layer. Alternatively, some of the tracks may have the multi-layer structure while others may have a single metal layer.

In the multi-layer structure, the copper layer provides a good material for forming the circuit shape, the nickel layer helps preventing copper migration and provides additional strength, and the gold layer is preferable in wire bonding and both electrical and heat conduction and thereby is very suitable for having the LED's attached thereto. According to one embodiment, the copper layer is approximately 17.78 micro-meter thick, the nickel layer is between 2.54 to 7.62 micro-meter in thickness and the gold layer is at least 0.76 micro-meter in thickness. The relatively thick copper layer provides for a sufficient cross-section for corresponding electrical energy supply, the nickel layer is kept relatively thinner in comparison to the copper layer. The gold layer is also kept thinner than the nickel layer in order to save costs.

The heat sink tracks or traces 122 and 125 are between the electrical tracks such that they are parallel to the corresponding anode and cathode tracks. In addition and as can be seen from FIG. 4, the light unit 100 further includes an additional heat sink in a form of a metal frame 108 arranged on the substrate layer 103. The metal frame 108 is in contact with the heat sink tracks 122 and 125 and is continuously extending around the substrate layer 103. With the metal frame 108, the heat from the LEDs 102–102n is transported to the metal frame 108 via the corresponding heat sink tracks.

As can be seen from FIGS. 1–3, the substrate 103 is attached to a heat sink metal plate 105 via a thermally conductive tape 104. The tape 104 can be glue or paste. The metal plate 105 is also in contact with the heat sink tracks (e.g., the tracks 122 and 124 in FIG. 4) on the substrate 103 and the frame 108. The heat sink metal plate 105 can be very thin so that it can be easily bent to follow any required contour together with the flexible substrate 103. In addition, the metal plate 105 also serves as a base support for the flexible substrate 103 with the LEDs 102–102n mounted thereon.

Each of the LEDs 102–102n can be a high power surface mountable LED. In one embodiment, each of the LEDs is a High Flux SMT LED manufactured by Agilent Technologies, Inc. of Palo Alto, Calif. Alternatively, other types of LEDs can be used.

The LEDs 102–102n are mounted on and along the respective electrical tracks (e.g., the tracks 121, 123–124, and 126). Each of the LEDs 102–102n is mounted in such a way that an anode terminal (not shown) of the LED is electrically connected to its corresponding anode track on the substrate 103, such as by soldering using screening technique or gluing, and a cathode terminal (not shown) of the LED is electrically connected to the corresponding cathode track on the substrate 103.

In one embodiment, each of the LEDs 102–102n is attached to the corresponding electrical tracks using the Surface Mounting Technology (SMT). This makes the light unit 100 an SMT-LED-package-on-flexible-substrate assembly.

FIG. 5 shows a cross-sectional view of a portion of the light unit 100, showing how each of the LEDs 102–102n is mounted on the tracks (e.g., the tracks 121–126 of FIG. 4) on the flexible substrate 103 that is attached to the metal plate 105 via the adhesive tape 104. As can be seen from FIG. 5, solder paste is deposited on the exact locations of the anode and cathode tracks 131–132 using, for example, screening techniques. Thermally conductive glue is also applied to the heat sink track 133 using, for example, dispensing technique. The LED 102i is then placed onto the respective electrical tracks 131–132, with the anode and cathode terminals of the LED 102i corresponding to the solder paste deposited on the anode and cathode tracks 131–132. The LED 102i is so placed such that its heat sink is in contact with the thermally conductive glue deposited on the heat sink track 133. The LED 102i is subsequently secured on the tracks 131–133 by reflow soldering of the solder paste and curing the thermally conductive glue, respectively.

Referring back to FIGS. 1–3, the optical lens 101 is provided to control, for example, the focusing or spreading of light emitted by the LEDs 102–102n. The lens 101 is arranged slightly above the LEDs 102–102n with air gap 110 between the lens 110 and the LEDs 102–102n.

The lens 101 may not be present in the light unit 101, or may be replaced with something else. In one embodiment, the lens 101 may be replaced with a transparent (or colored) cover. In another embodiment, the lens 101 may be replaced with other types of cover. Yet in other embodiments, the light unit 100 may simply not include the lens 101. In this case, the LEDs may be encapsulated with, for example, transparent epoxy and there is no air gap 110.

In one embodiment, the thickness of the metal plate 105 is about 0.64 mm (millimeter), the thickness of the substrate 103 is about 0.15 mm, the thickness of each of the LEDs 102–102n is about 2.20 mm and the thickness of the optical lens 110 is about 2.55 mm. This means that the assembled light unit 100 has a thickness of about 7.0 mm.

This thin and flexible light unit 100 eliminates the necessity of having a space-wasting tail lamp pocket for a motor vehicle. Any motor vehicle lamp that employs the light unit 100 as the light source does not need a deep lamp pocket, since the light unit 100 is substantially flat in comparison with an incandescent lamp while still providing for sufficient light. Because of its flexibility, the light unit can be attached to a transparent part of the lamp, flexibly following the contour of this transparent part.

Figure 6:
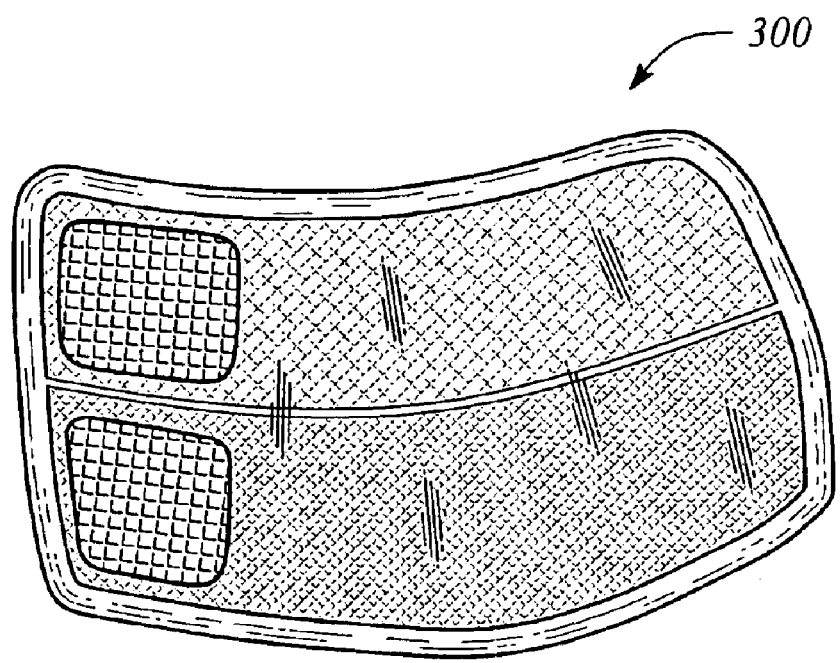
FIG. 6 shows a front view of a motor vehicle lamp that includes the light unit as shown in FIGS. 1–5.
Figure 7:
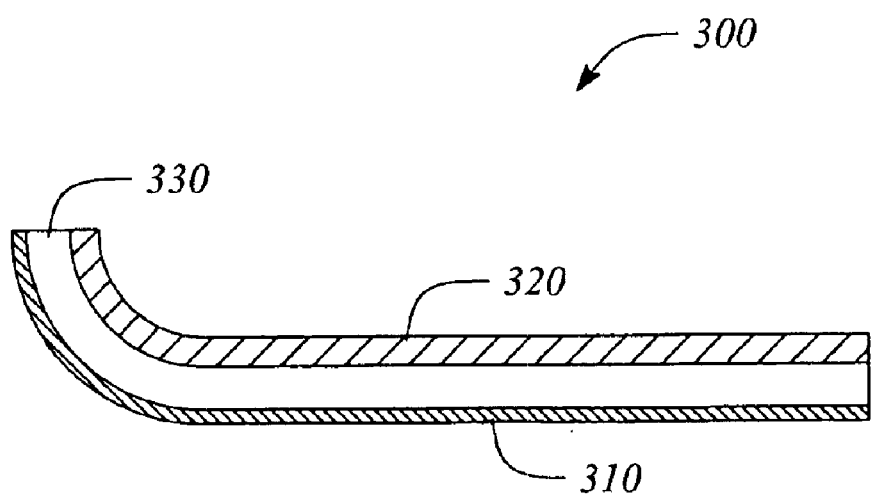
FIG. 7 shows a top view of the motor vehicle lamp of FIG. 6.
Figure 8:
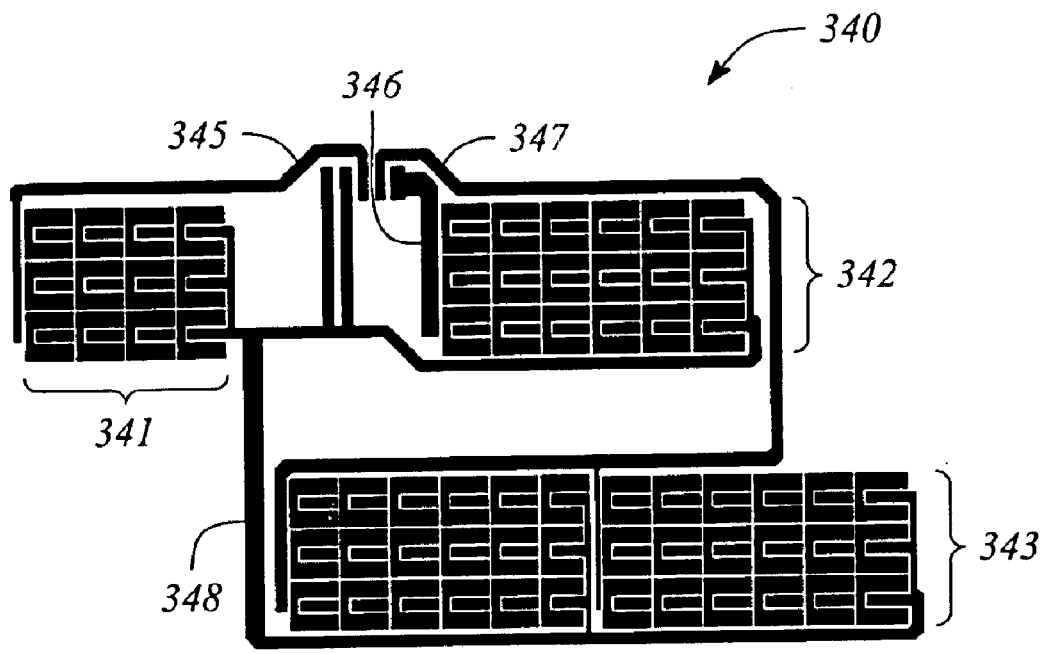
FIG. 8 shows a schematic layout of electrical and heat sink tracks to be used in a light unit for the motor vehicle lamp of FIG. 6.
Figure 9:
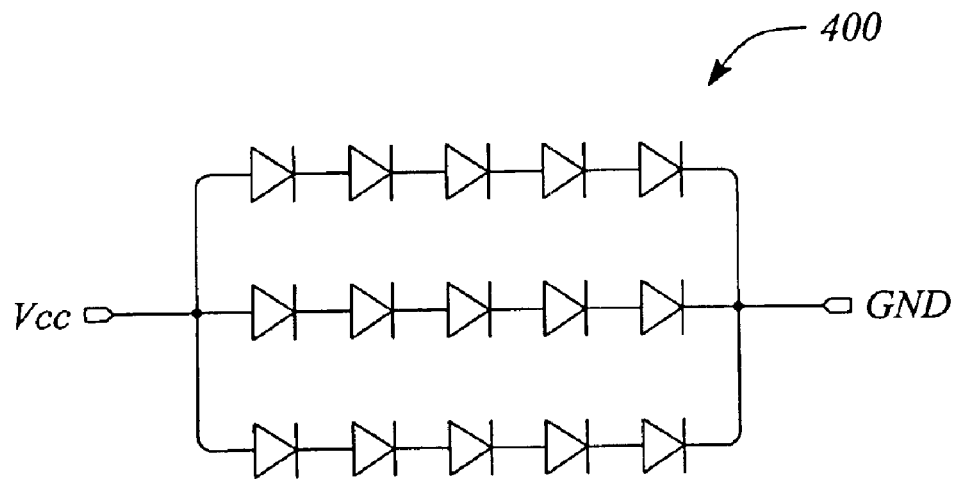
FIG. 9 shows a schematic circuit layout of the LEDs in the light unit of FIGS. 6–8.

FIGS. 6–9 show a motor vehicle lamp 300 that employs a light unit made in accordance with one embodiment of the present invention, as described above in connection with FIGS. 1–5. FIG. 6 shows a front view of the motor vehicle lamp 300. FIG. 7 shows a top view of the motor vehicle lamp 300. FIG. 8 shows a schematic layout of electrical and heat sink tracks to be used in the light unit for the motor vehicle lamp 300 and FIG. 9 shows a schematic circuit layout of the LEDs in the light unit of the lamp 300.

As can be seen from FIGS. 6–7, the lamp 300 includes a lens 310 and a light unit 320. An air gap 330 is between the lens 310 and the light unit 320. It can be seen from FIGS. 6–7 that the lamp 300 that implements one embodiment of the invention is very thin, and is flexible enough to be bent to follow the contour of the lamp 300.

Referring to FIG. 8, the electrical and heat sink tracks 340 of the light unit 320 are shown. As can be seen from FIG. 8, three cluster of LED positions 341–343, onto which LED's are to be mounted, are used for three different indication of the car. The first cluster 341 includes twelve LED positions arranged in three rows, each row comprising four LED positions. A second cluster 342 is arranged to the right side of the first cluster 341. The second cluster 342 includes eighteen LED positions arranged in three rows, each row comprising six LED positions. A third cluster 343 is arranged directly below the second cluster 342. The third cluster 343 includes thirty-six LED positions arranged in three rows, each row comprising twelve LED positions.

The electrical energy to the first cluster 341 is controlled by a first anode track 345, indicating a "Reverse" light. The electrical energy to the second cluster 342 is controlled by a second anode track 346, indicating a "Signal" light. The electrical energy to the third cluster 343 is controlled by a third anode track 347, indicating a "Brake" light. All the clusters have a common cathode track 348. FIG. 9 show a schematic circuit layout of the LEDs on the circuit layout 340 of FIG. 8.

The present invention is not limited to the above-mentioned modes for carrying out the present invention, and it is understood that various configurations can be obtained in a range that does not depart from the purport of the present invention.

What is claimed is:

1. A light unit comprising:
   a thin and flexible substrate layer;
   a plurality of flexible tracks, including at least a heat sink track, formed on the flexible substrate, wherein the flexible tracks further comprise an anode track and a cathode track, and wherein the heat sink track is formed between the anode and cathode tracks;
   a plurality of Light Emitting Diodes (LEDs) arranged on the flexible substrate layer along the flexible tracks and being electrically connected to some of the flexible tracks such that the light unit is both thin and flexible.

2. The light unit of claim 1, wherein the flexible substrate layer comprises an electrically insulating material and is about 25.4 micrometer in thickness.

3. Light unit of claim 1, wherein the flexible tracks are multi-layer tracks that comprise a copper layer on the substrate layer, a nickel layer arranged over the copper layer, and a gold layer over the nickel layer.

4. The light unit of claim 3, wherein the copper layer is about 17.78 micro-meter thick, the nickel layer is between 2.54 to 7.62 micro-meter in thickness and the gold layer is at least 0.76 micrometer in thickness.

5. The light unit of claim 1, wherein each of the LEDs is arranged on the substrate layer along the flexible tracks using a surface mount technology.

6. A light unit comprising:
   a thin and flexible substrate layer;
   a plurality of flexible tracks, including at least a heat sink track, formed on the flexible substrate;
   a plurality of Light Emitting Diodes (LEDs) arranged on the flexible substrate layer along the flexible tracks and being electrically connected to some of the flexible tracks such that the light unit is both thin and flexible;
   a heat-conducting frame surrounding the substrate layer, the heat sink track being thermally connected to the frame.

7. The light unit of claim 6, further comprising a heat conducting metal plate attached with the substrate layer via an adhesive paste and in contact with the heat-conducting frame.

8. The light unit of claim 6, wherein the flexible substrate layer comprises an electrically insulating material and is about 25.4 micrometer in thickness.

9. A motor vehicle lamp comprising:
   a light unit that further comprises
      a thin flexible substrate layer;
      a plurality of flexible tracks, including at least a heat sink track, formed on the flexible substrate, wherein the flexible tracks further comprise an anode track and a cathode track, and wherein the heat sink track is formed between the anode and cathode tracks;
      a plurality of Light Emitting Diodes (LEDs) arranged on the substrate layer along the flexible tracks and being electrically connected to some of the flexible tracks such that the light unit is both thin and flexible.

10. The motor vehicle lamp of claim 9, wherein the flexible substrate layer comprises an electrically insulating material and is about 25.4 micrometer in thickness.

11. The motor vehicle lamp of claim 9, wherein the flexible tracks are multi-layer tracks that comprise a copper layer on the substrate layer, a nickel layer arranged over the copper layer, and a gold layer over the nickel layer.

12. The motor vehicle lamp of claim 11, wherein the copper layer is approximately 17.78 micrometer thick, the nickel layer is between 2.54 to 7.62 micrometer in thickness and the gold layer is at least 0.76 micro-meter in thickness.

13. The motor vehicle lamp of claim 9, wherein the lamp is a tail lamp.

14. The motor vehicle lamp of claim 9, further comprising a casing within which the light unit is arranged with the transparent part being provided as a cover covering the casing.

15. The motor vehicle lamp of claim 9, wherein the light unit further comprises an optical lens arranged on the LEDs for controlling light emitted thereby, wherein each of the LEDs is arranged on the substrate layer along the flexible tracks using a surface mount technology.

16. A motor vehicle lamp comprising:
a light unit that further comprises
a thin flexible substrate layer;
a plurality of flexible tracks, including at least a heat sink track, formed on the flexible substrate;
a plurality of Light Emitting Diodes (LEDs) arranged on the substrate layer along the flexible tracks and being electrically connected to some of the flexible tracks such that the light unit is both thin and flexible; and
a heat-conducting frame surrounding the substrate layer, the heat sink track being thermally connected to the frame.

17. The motor vehicle lamp of claim 16, wherein the light unit further comprises a heat conducting metal plate attached with the substrate layer via an adhesive paste and in contact with the heat-conducting frame.

18. The motor vehicle lamp of claim 16, wherein the flexible substrate layer comprises an electrically insulating material and is about 25.4 micrometer in thickness.

19. The motor vehicle lamp of claim 16, wherein the lamp is a tail lamp.

20. The motor vehicle lamp of claim 16, further comprising a casing within which the light unit is arranged with the transparent part being provided as a cover covering the casing.

21. The motor vehicle lamp of claim 16, wherein the light unit further comprises an optical lens arranged on the LEDs for controlling light emitted thereby, wherein each of the LEDs is arranged on the substrate layer along the flexible tracks using a surface mount technology.

* * * * *